(12) United States Patent
Hoenigschmid

(10) Patent No.: US 6,522,579 B2
(45) Date of Patent: Feb. 18, 2003

(54) NON-ORTHOGONAL MRAM DEVICE

(75) Inventor: Heinz Hoenigschmid, Fishkill, NY (US)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 09/818,010

(22) Filed: Mar. 27, 2001

(65) Prior Publication Data

US 2002/0097601 A1 Jul. 25, 2002

Related U.S. Application Data

(60) Provisional application No. 60/263,966, filed on Jan. 24, 2001.

(51) Int. Cl.$^7$ .............................................. G11C 11/15
(52) U.S. Cl. ..................... 365/173; 365/63; 365/158; 257/108
(58) Field of Search .......................... 257/108; 365/173, 365/158, 63

(56) References Cited

U.S. PATENT DOCUMENTS

| | | | |
|---|---|---|---|
| 5,695,864 A | | 12/1997 | Slonczewski |
| 5,716,719 A | | 2/1998 | Saito et al. |
| 5,747,997 A | | 5/1998 | Dahlberg et al. |
| 6,005,800 A | * | 12/1999 | Koch et al. .................. 365/173 |
| 6,104,633 A | * | 8/2000 | Abraham et al. ............ 365/171 |
| 6,178,131 B1 | * | 1/2001 | Ishikawa et al. ............ 365/157 |

* cited by examiner

*Primary Examiner*—Hoai Ho
(74) *Attorney, Agent, or Firm*—Slater & Matsil, L.L.P.

(57) ABSTRACT

An MRAM device (100) and method of manufacturing thereof having wordlines (112) that run non-orthogonal relative to bitlines (122), resulting in lower current and power consumption.

28 Claims, 6 Drawing Sheets

NON-ORTHOGONAL MRAM DEVICE

This patent claims the benefit of U.S. Provisional Patent Application Ser. No. 60/263,966, filed Jan. 24, 2001, which is incorporated herein by reference.

TECHNICAL FIELD

The present invention relates generally to the fabrication of semiconductor devices, and more particularly to magnetic random access memory (MRAM) devices.

BACKGROUND OF THE INVENTION

Semiconductors are used for integrated circuits for electronic applications, including radios, televisions, cell phones, and personal computing devices, as examples. One type of semiconductor device is a semiconductor storage device, such as a dynamic random access memory (DRAM) and flash memory, which use an electron charge to store information.

A more recent development in memory devices involves spin electronics, which combines semiconductor technology and magnetics. The spin of an electron, rather than the charge, is used to indicate the presence of a "1" or "0". One such spin electronic device is a magnetic random-access memory (MRAM), which includes conductive lines positioned perpendicular to one another in different metal layers, the conductive lines sandwiching a magnetic stack. The place where the conductive lines intersect is called a crosspoint. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1", is storable in the alignment of magnetic moments. The resistance of the magnetic component depends on the moment's alignment. The stored state is read from the element by detecting the component's resistive state. A memory cell may be constructed by placing the conductive lines and crosspoints in a matrix structure having rows and columns.

An advantage of MRAMs compared to traditional semiconductor memory devices such as DRAMs is that MRAMs are non-volatile. For example, a personal computer (PC) utilizing MRAMs would not have a long "boot-up" time as with conventional PCs that utilize DRAMs. Also, an MRAM does not need to be powered up and has the capability of "remembering" the stored data.

A disadvantage of current MRAM designs is that a large amount of current is required to switch the cells, e.g. the amount of current that must be passed through the bitlines and wordlines is high. Therefore, a large amount of power is used.

What is needed in the art is an MRAM design that requires less current and power to switch the resistive state or logic state of the memory cells.

SUMMARY OF THE INVENTION

The present invention achieves technical advantages as a non-orthogonal MRAM device requiring less current and power than prior art MRAMs to change the logic state of the memory cells. Bitlines and wordlines are formed non-orthogonal to one another, that is, at an angle other than 90 degrees, preferably ranging from slightly more than 0 to less than 90 degrees.

Disclosed is a semiconductor memory device comprising at least one first conductive line, at least one memory storage cell disposed over the first conductive line, and at least one second conductive line disposed over the first conductive line. The second conductive line is positioned non-orthogonal relative to the first conductive line, and the memory storage cell has material properties based on an asteroid-shaped curve.

Also disclosed is an MRAM device, comprising a plurality of first conductive lines, a plurality of second conductive lines disposed over the first conductive lines and positioned at an angle other than 90 degrees with respect to the first conductive lines, and a plurality of memory storage cells disposed between and adjacent to the first and second conductive lines.

Further disclosed is a method of manufacturing a semiconductor memory device, comprising forming at least one first conductive line, forming at least one memory storage cell disposed over the first conductive line, and forming at least one second conductive line over the memory storage cell non-orthogonal relative to the first conductive line. The memory storage cell has material properties based on an asteroid-shaped curve.

Also disclosed is a method of programming an MRAM device, comprising sending a first current through the first conductive lines, wherein the first current creates a first electromagnetic field around the first conductive lines, and sending a second current through the second conductive lines, wherein the second current creates a second electromagnetic field around the second conductive lines, wherein the second field is different than the first field.

A memory storage cell used in embodiments of the present invention may comprise a magnetic stack that includes a tunnel junction. The tunnel junction may comprise a rectangular or non-rectangular parallelogram shape, or a trapezoidal shape.

Advantages of the invention include reducing the amount of current required in a wordline and/or bitline to switch the charge stored in the memory cell. Reducing the current results in a power savings for the memory device. Damage and reduced life of memory devices, due to electromigration is also alleviated by the use of lower current on wordlines and bitlines.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

Prior art orthogonal MRAM designs will be described, followed by a discussion of some preferred embodiments and some advantages of the present invention.

Figure 1:
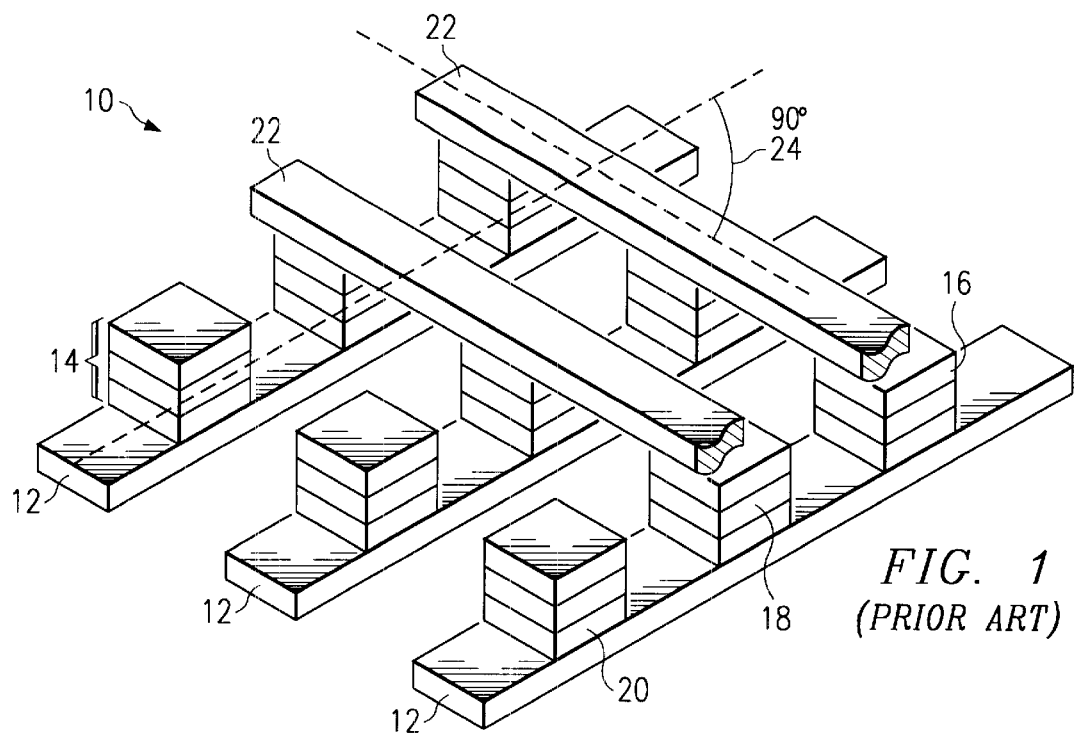
FIG. 1 illustrates a prior art MRAM device in a perspective view having wordlines that are orthogonal to bitlines.

FIG. 1 illustrates a perspective view of a prior art MRAM device 10 having wordlines 12 positioned orthogonal to bitlines 22, e.g. the angle 24 between wordlines 12 and bitlines 22 is perpendicular, or equal to 90 degrees. A magnetic stack 14 is disposed between and adjacent to wordlines 12 and bitlines 22. The magnetic stack 14 includes a soft layer 16, a tunnel layer or tunnel junction 18, and a hard layer 20, for example. A logic state is storable in the alignment of magnetic moments in the magnetic stack, as previously described, by sending a current through the wordlines 12 and bitlines 22.

Figure 2:
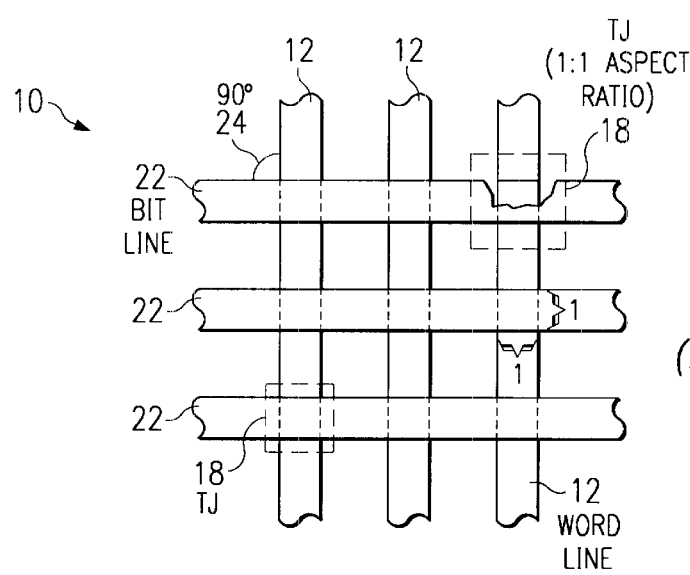
FIGS. 2 and 3 illustrate top views of prior art MRAM devices having wordlines orthogonal to bitlines.
Figure 3:
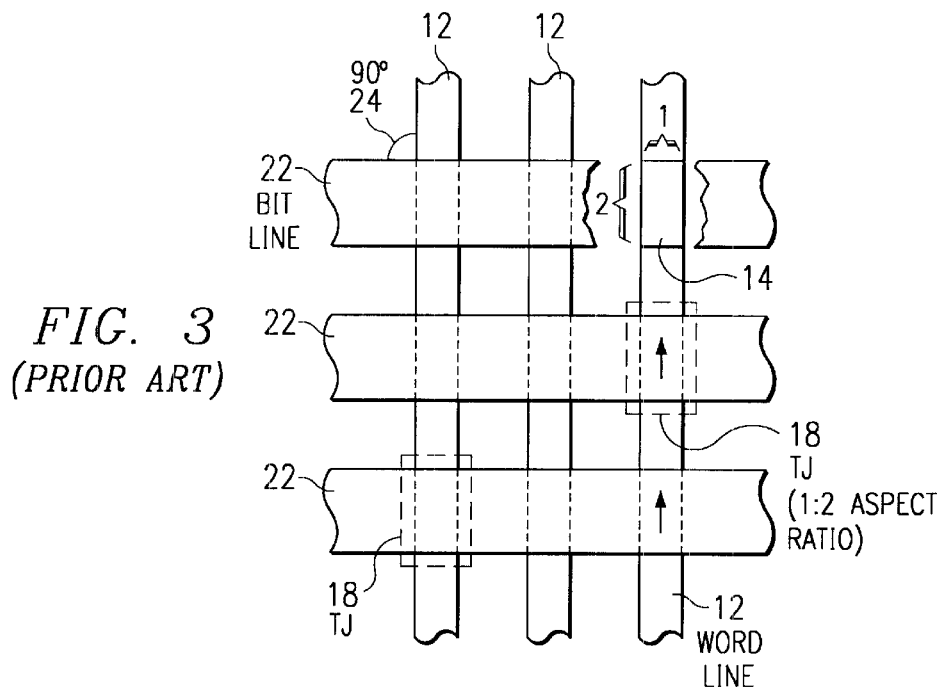

FIG. 2 shows a top view of a prior art MRAM 10 having wordlines 12 orthogonal to bitlines 22 at a 90° angle 24. The tunnel junctions (TJ) 18 shown have a 1:1 aspect ratio. FIG. 3 shows another prior art MRAM device having wordlines 12 orthogonal to bitlines 22, and a tunnel junction 18 having a 2:1 aspect ratio.

Figure 4:
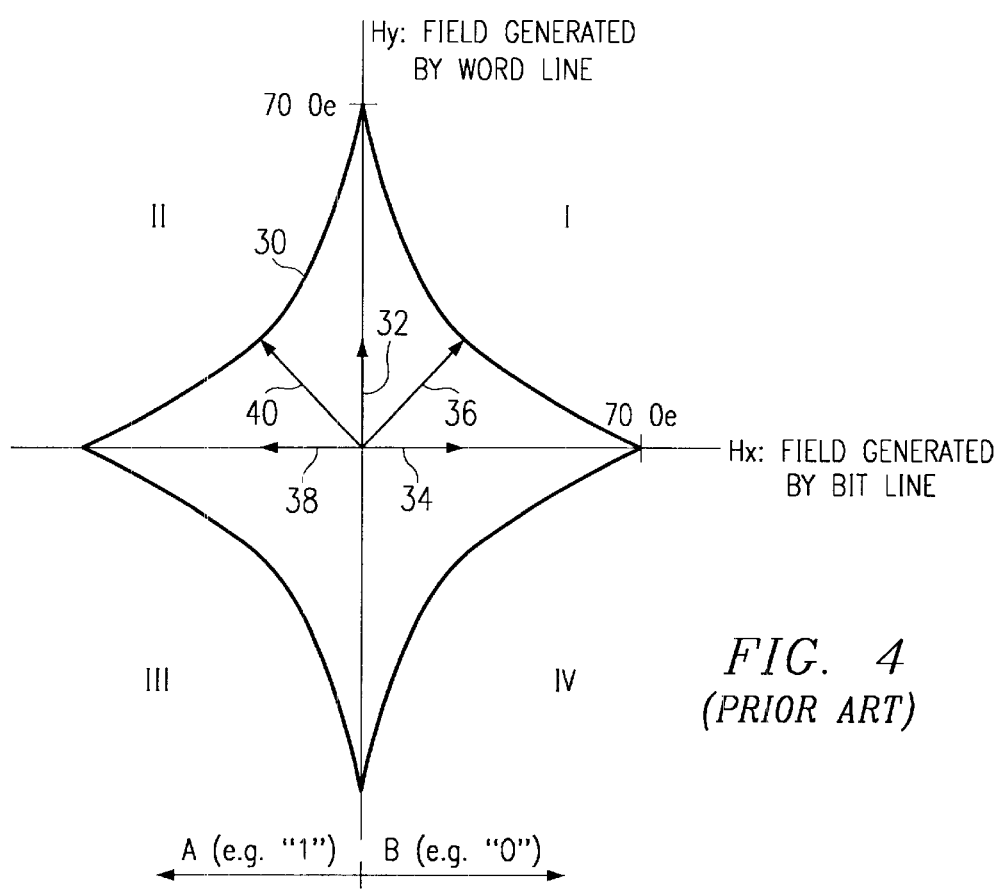
FIG. 4 illustrates an asteroid curve representing the hysteresis properties of the magnetic materials used in a prior art MRAM device.

FIG. 4 shows a graph of an asteroid curve 30 that represents the hysteresis properties of the magnetic stack 14 memory cell material and illustrates a prior art method of addressing a MRAM memory device. The $H_x$ axis represents an electromagnetic field produced by a bitline 22 which is created by running a current through the bitline 22. The electromagnetic field is produced in accordance with the "right-hand rule" of electromagnetics. Similarly, the $H_y$ axis represents the electromagnetic field produced by a wordline 12 when a current is run through a wordline 12. Vector 32 along the $H_y$ axis represents the electromagnetic field created by a positive current that is run through a wordline 12. Vectors 34 and 38 along the $H_x$ axis represent the electromagnetic field created by a positive and negative current, respectively, that is run through a bitline 22 in order to write a logic "0" or "1" to a memory cell (magnetic stack 14), respectively. In the prior art asteroid 30 shown, the wordline current represented by vector 32 remains positive, and is often referred to as an enabling current.

To switch a resistive state, or logic state, of a memory cell 14, the resultant vector 36 produced by adding vectors 34 and 32, representing the superposition of the two electric fields generated by the wordline and bitline currents, must reach a point on the asteroid curve 30 in quadrant I. For example, to write a logic "0" to a magnetic stack 14, a current producing an electromagnetic field represented by vector 34 is run through bitline 22 and a current producing an electromagnetic field represented by vector 32 is run through a wordline 12. The resultant vector 36 shown exactly hits the asteroid curve 30, and this vector 36 represents the minimum electromagnetic field (and associated electrical current) that must be supplied on the wordline 12 and bitline 22 to switch the cell 14. Similarly, to write a logic "1" to the memory cell 14, a current creating an electromagnetic field represented by the vector 38 along the $H_x$ axis is run through the bitline 22 and a current creating an electromagnetic field represented by the vector 32 is run through the wordline 12 along the Hy axis, producing a resultant vector 40 which reaches the asteroid curve 30 in quadrant II. In the prior art, the electromagnetic fields represented by vectors 32 and 34 are of equal amplitudes.

In the asteroid curve 30 shown, vectors 34 and 32 are positioned orthogonal to one another. The electromagnetic fields represented by these vectors are orthogonal because the wordlines 12 and bitlines 22 of the prior art MRAM devices 10 run orthogonal to one another.

A problem with running the wordlines 12 orthogonal to the bitlines 22 is that often, the current that must be supplied to switch the memory cell 14 is high, e.g. five to ten milliamps. This requires a great deal of power by the MRAM device 10. Furthermore, because the wordlines 12 and bitlines 22 are often very small, e.g. 0.1 $\mu$m wide, electromigration is a problem. The metallization material of the wordlines 12 and bitlines 22 can migrate from the high current running through them, which can result in the accumulation of the metal in certain locations and create shorts or breaks in the wordlines 12 and bitlines 22.

Figure 5A:
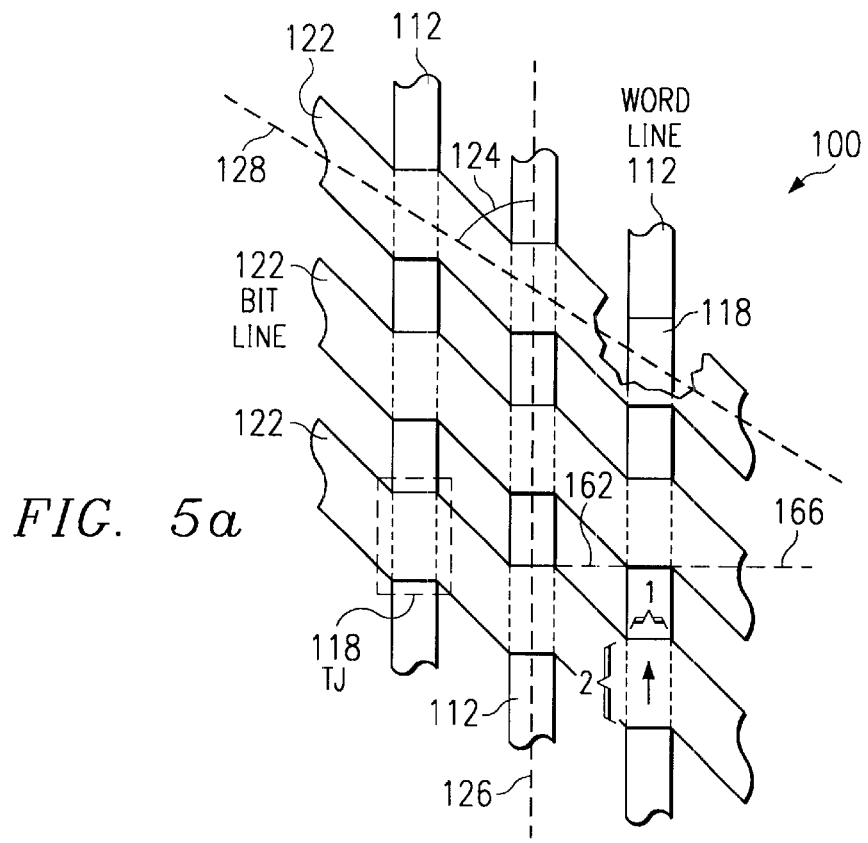
FIGS. 5a and 5b illustrate layouts of preferred embodiments of the present invention from a top view.

The present invention solves these problems in the prior art of high current and power requirements for switching the logic state of memory cells 14. An embodiment of the layout of the present invention is shown in FIG. 5a. Wordlines 112 are positioned non-orthogonal to bitlines 122, as shown in the top view. Preferably, angle 124 is an angle other than 90 degrees, for example, between about zero and about less than 90 degrees, e.g., about 60 degrees, as shown. The angle 124 is shown as being the angle between a centerline 126 of a wordline 112 and a centerline 128 of a bitline 122. Angle 124 may range from 10 to 80 degrees, as an example.

In the embodiment shown in FIG. 5a, the tunnel junction 118 of the magnetic stack 114 preferably has an aspect ratio of between 1:1 and 1:3. As shown, the magnetic stack 114 has a shape that is preferably a rectangle. Furthermore, the embodiment shown has wordlines 112 that do not interleave from wordline to wordline. For example, the right edge 162 of a tunnel junction 118 in the middle wordline 112 does not overlay or interleave the left edge 166 of an adjacent tunnel junction 118 in the lower wordline 112.

Figure 5B:
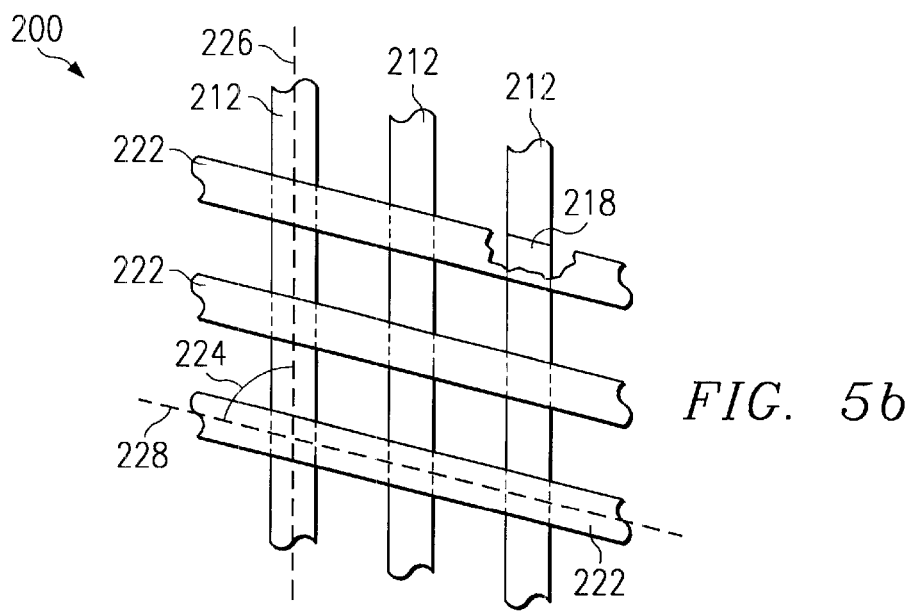

FIG. 5b illustrates an alternative embodiment of an MRAM device 200 having wordlines 212 positioned non-orthogonally to bitlines 222 as represented by an angle 224 that is less than 90 degrees. In this embodiment, the tunnel junctions 218 are shown having a non-rectangular parallelogram shape. However, the rectangular shaped tunnel junctions 118 shown in FIG. 5a are the preferred shape of the tunnel junctions in accordance with an embodiment of the present invention.

Figure 6A:
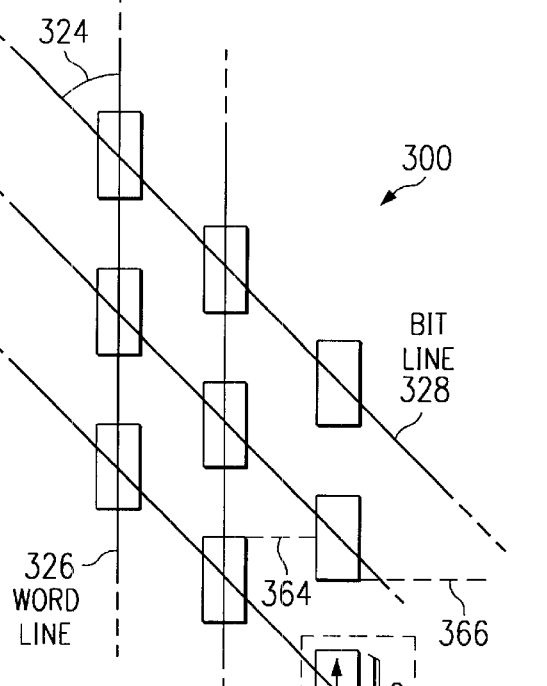
FIGS. 6a and 6b illustrate top views of preferred embodiments of the present invention having varying aspect ratios and non-orthogonal angles of wordlines to bitlines.
Figure 6B:
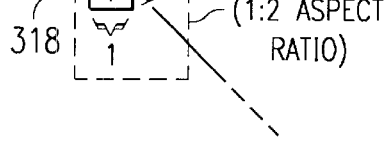

FIGS. 6a and 6b illustrate alternative embodiments of the present invention having varying aspect ratios and non-orthogonal angles 324 and 424. The size and aspect ratio of the tunnel junction 318/418 has an effect on the angle 324 and 424. FIG. 6a illustrates an embodiment where the aspect ratio of the tunnel junction 318 is 1:2. This results in a reduced non-orthogonal angle 324, and also results in the interleaving of the tunnel junctions 318. The term "interleaving" of tunnel junctions is used herein to refer to the tunnel junctions 318 being shifted with respect to tunnel junctions 318 in proximate wordlines. This tunnel junction 318 interleaving is illustrated by observing the right edge 364 of tunnel junction 318 in the middle wordline 112 and comparing it to the left edge 366 of the middle tunnel junction 318 in the bottom wordline. The middle tunnel junction right edge 364 overlaps the middle tunnel junction 318 left edge 366.

Figure 6B:

FIG. 6b illustrates an MRAM device 400 in accordance with the present invention in which the tunnel junctions 418 have an aspect ratio of 1:3. This results in an even more reduced, e.g. smaller than angle 324 in FIG. 6, non-orthogonal angle 424 and even more interleaving of the rows of tunnel junctions 418. The interleaving or overlapping of the tunnel junctions 418 is observable by examining the right edge 462 of the middle wordline 412 tunnel junction 418 compared to the left edge 466 of the lower wordline 412 middle tunnel junction 418, for example.

Figure 7:
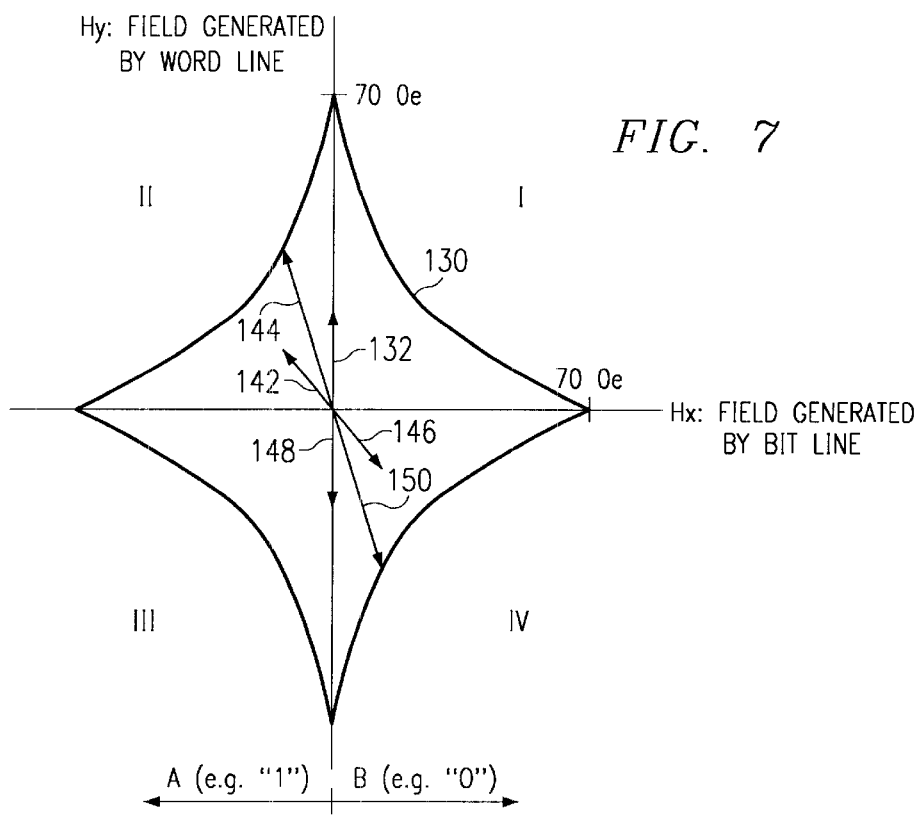
FIG. 7 shows an asteroid curve in accordance with the present invention.

FIG. 7 illustrates an asteroid-shaped curve 130 and the vectors produced by current running through the non-orthogonal wordlines 112/212/312/412 and bitlines 122/222/322/422, illustrating a preferred method of addressing a memory device in accordance with the present invention. To write a logic "1" to a non-orthogonal MRAM device in accordance with the present invention, a positive current is run through a wordline 112, represented by vector 132. A negative current is run through a bitline 122, represented by vector 142. A resultant vector 144 is shown, that reaches the asteroid curve 130 in quadrant II. Referring again to the prior art asteroid curve 30 shown in FIG. 4, note that a smaller amount of current is required to switch the non-orthogonal MRAM cell 100 to a logic "1"e.g. 9 milliamps in FIG. 7 versus 11 milliamps in FIG. 4. This is observable by noting the smaller size bitline vector 142 compared to the prior art vector 38.

Referring again to FIG. 7, similarly, a smaller amount of current is required to switch the memory cell of a non-orthogonal MRAM 100 to a logic "0". A negative current, represented by the vector 148, is run through a wordline 112, and a positive current, represented by vector 146, is run through a bitline 122. The resultant vector 150 in quadrant IV reaches the asteroid curve 130, as shown. Again, comparing vector 146 of FIG. 7 to vector 34 of FIG. 4, it is apparent that a smaller amount of current on the bitline 122 is required to switch the non-orthogonal MRAM 100 to a logic "0". When a smaller current is used, less power is consumed by the memory device 100 when changing the logic state of the memory cells 118.

Also illustrated in the asteroid curve of FIG. 7 is the ability to use bitline and wordline currents that generate electromagnetic fields that are different in order to program a memory device. For example, the electromagnetic field represented by vector 142 is different from the electromagnetic field represented by vector 132, e.g. vector 142 is smaller than vector 132.

Note that in FIG. 7, a negative wordline current 148 is required to change the logic state of a memory cell to a "0". This is not problematic, because in prior art MRAM devices 10, periodically, the wordline current is reversed to alleviate the effects of electromigration, due to potential accumulation of copper and other conductive metal in the conductive lines due to constantly running a current through the conductive lines. For example, the wordline current may be reversed every second switch or every second writing in the prior art.

Figure 8:
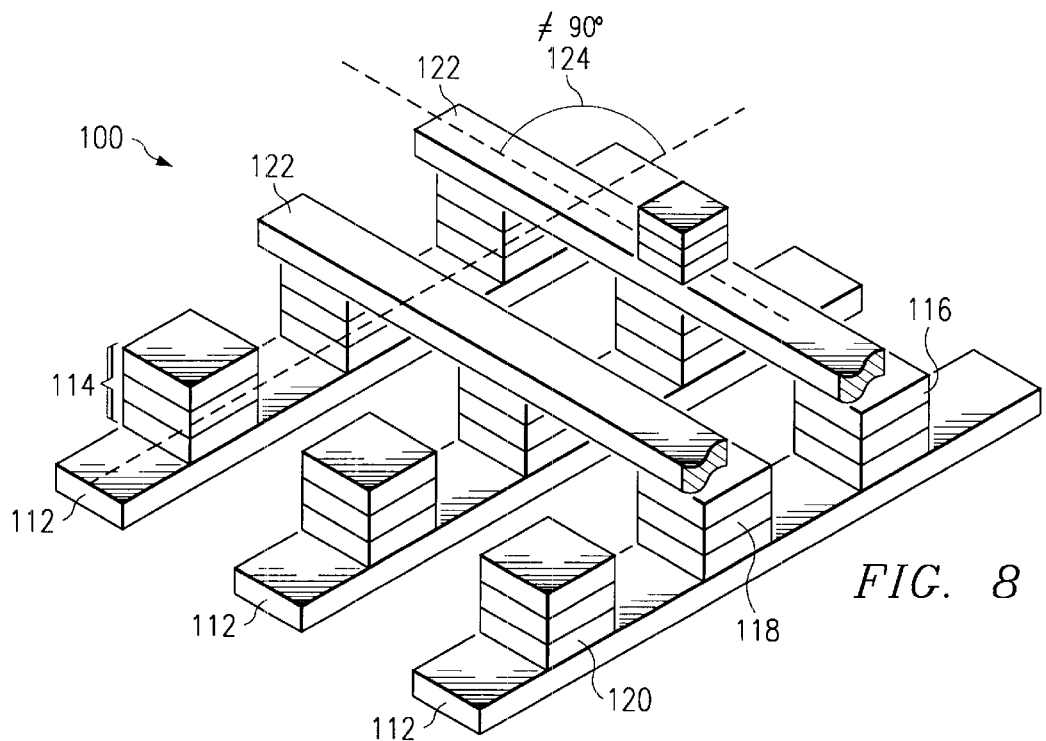
FIG. 8 illustrates a perspective view of an embodiment of the present MRAM device.
Figure 9:
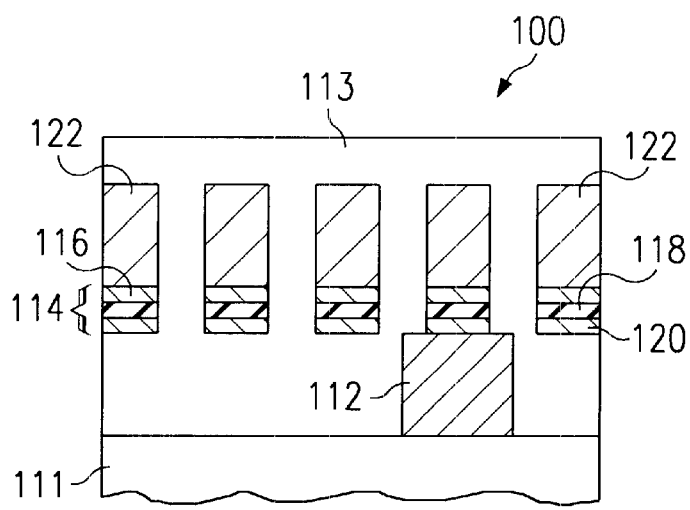
FIG. 9 illustrates a cross-sectional view of the present MRAM device.

FIG. 8 shows a perspective view of the non-orthogonal MRAM device 100 in accordance with the present invention, and FIG. 9 illustrates a cross-sectional view of the present MRAM device 100.

A process flow for manufacturing the non-orthogonal MRAM device 100/200/300/400 in accordance with the present invention will next be described, with reference to FIG. 9.

A workpiece 111 is provided, typically comprising silicon oxide over single-crystal silicon, not shown. The workpiece may include other conductive layers or other semiconductor elements, e.g., transistors, diodes, vias, etc. Compound semiconductors such as GaAs, InP, Si/Ge, and SiC may be used in place of silicon, as examples.

A dielectric layer 111 is deposited over the workpiece. The dielectric layer 111 may comprise silicon oxide, and may also comprise a low dielectric constant material or other dielectric materials, for example. Examples of other suitable dielectrics include Silk™, fluorinated silicon glass, and FOX™, for example. The dielectric layer 113 may comprise several layers of dielectric material, for example, not shown.

First conductive lines 112 are formed over the workpiece 111 within dielectric layer 113. First conductive lines 112 preferably comprise copper, aluminum, combinations thereof, or other metals. First conductive lines 112 may be formed in a second metallization (M2) layer, for example, although first conductive lines 112 may be formed in other metallization layers.

Magnetic stacks 114 are formed over conductive lines 112. The magnetic stacks 114 comprise a bottom metal stack 120, a tunnel junction 118 and a top metal stack 116. Bottom metal stack 120, also referred to in the art as a hard layer, is deposited over first wordlines 112. Bottom metal stack 120 preferably comprises a plurality of metal layers, comprising PtMn, CoFe, Ru, and NiFe, for example, although other types of suitable magnetic materials and metal layers may be used. Four to eight layers are typically used for the bottom metal stack 120. Various techniques such as physical vapor deposition (PVD), ion beam sputtering, evaporation, and chemical vapor deposition (CVD) may be used to deposit the magnetic layers of bottom metal stack 140. Because each layer is very thin, e.g. most of them <100 Angstroms, preferably, the layers are deposited by PVD. Preferably, bottom metal layer 140 is between 200 and 400 Angstroms thick.

Magnetic stack 114 also comprises a thin dielectric layer 118, often referred to as a tunnel layer or tunnel junction, deposited over bottom metal stack 120. Tunnel junction 118 preferably may comprise, for example, aluminum oxide ($Al_2O_3$), and is preferably 10–15 Angstroms thick.

Magnetic stack 114 also comprises a top metal layer 116, often referred to as a soft layer, deposited over insulating layer 118. Top metal layer 116 comprises a plurality of magnetic layers, for example, and may comprise similar materials deposited using similar processes as are used to form bottom metal layer 120. The total thickness of magnetic stack 116 may be, for example, 500 Angstroms.

Second conductive lines 122 are formed over magnetic stacks 114 and first conductive lines 112 at an angle non-orthogonal and non-perpendicular to first conductive lines 112. First 112 and second 122 conductive lines function as bitlines or wordlines of the MRAM memory array. Second conductive lines 122 may be formed in a third metallization (M3) layer, for example, although second conductive lines 122 may be formed in other metallization layers. Subsequent processing steps are then performed.

The present invention achieves technical advantages as a non-orthogonal MRAM device 100/200/300/400 that requires less current through the wordlines 112/212/312/412 and/or bitlines 122/222/322/422 to switch the logic state of the memory cell 114/214/314/414. As a result, less power is required to write to the MRAM device, and electromigration of the wordlines and bitlines is reduced. Therefore, an MRAM device is provided is more robust and has a longer life than prior art MRAMs.

Figure 10:
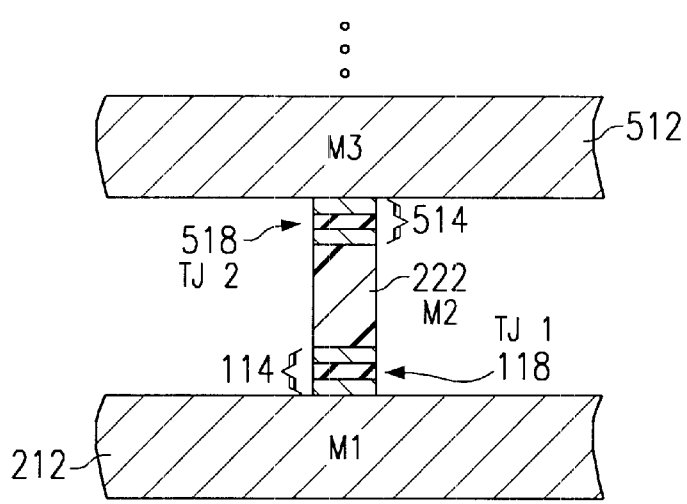
FIG. 10 illustrates an MRAM device having two or more magnetic stacks disposed between non-orthogonal conductive lines in accordance with an embodiment of the present invention.

The present invention has been described herein primarily in use in an MPAM device. However, the non-orthogonal first and second conductive lines are also beneficial for use with any memory storage cells having material properties based on a hysteresis loop, or an asteroid-shaped curve. A plurality of magnetic stacks 514 comprising tunnel junctions TJ2 (518) may be disposed over bitlines 222 between additional metallization layers (M3) which may comprise non-orthogonal wordlines 512 and/or bitlines, as shown in FIG. 10, in accordance with the present invention.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A semiconductor memory device comprising:
    at least one first conductive line;
    at least one first memory storage cell disposed over the first conductive line, the first memory storage cell having material properties based on an asteroid-shaped curve; and
    at least one second conductive line disposed over the first memory storage cell, wherein the second conductive line is orthogonal to the first conductive line at an intersected region of the first and second lines, and wherein the second conductive line is non-orthogonal to the first conductive line at non-intersected regions adjacent to and on either side of the intersected region.

2. The memory device according to claim 1, wherein the angle between the first conductive lines and the second conductive lines at the non-intersected regions is between 10 and 80 degrees.

3. The memory device according to claim 2, wherein the memory device is a magnetic random access memory (MRAM), wherein the first memory storage cell comprises a magnetic stack, the magnetic stack including a tunnel junction.

4. The memory device according to claim 3, wherein the tunnel junction has an aspect ratio of between about 1:1 and about 1:3.

5. The memory device according to claim 3, wherein the first conductive lines comprise wordlines and the second conductive lines comprise bitlines.

6. The memory device according to claim 5, wherein a logic state stored in the tunnel junction is switched by changing a current through the wordline and changing a current through the bitline.

7. The memory device according to claim 3, wherein the tunnel junction comprises a rectangular shape.

8. The memory device according to claim 3, wherein the tunnel junction comprises a trapezoidal shape.

9. The memory device according to claim 3, further comprising:
    at least one second memory storage cell disposed over the second conductive line; and
    at least one third conductive line disposed over the second memory storage cell, wherein the third conductive line is positioned non-orthogonal relative to the second conductive line.

10. The memory device according to claim 9, wherein the first memory storage cell comprises a magnetic stack, the magnetic stack including a tunnel junction.

11. The memory device according to claim 3, wherein the tunnel junction comprises a non-rectangular parallelogram shape.

12. A magnetic random access memory (MRAM) device, comprising:
    a plurality of first conductive lines;
    a plurality of second conductive lines disposed over the first conductive lines, the second conductive lines being positioned at an angle other than 90 degrees with respect to the first conductive lines; and
    a plurality of first memory storage cells disposed between and adjacent to the first and second conductive lines, wherein the first conductive lines are wordlines and the second conductive lines are bitlines, and wherein the first memory storage cells are interleaved such that an imaginary line perpendicular to the wordlines intersects a first one of the first memory storage cells located on a first one of the bitlines, and intersects a second one of the first memory storage cells located on a second one of the bitlines.

13. The MRAM device according to claim 12, wherein the first memory storage cells have material properties based on an asteroid-shaped curve.

14. The MRAM device according to claim 13, wherein the first memory storage cells comprise first magnetic stacks, the first magnetic stacks including tunnel junctions.

15. The MRAM device according to claim 14, wherein the tunnel junctions have an aspect ratio of between about 1:1 and about 1:3.

16. The MRAM device according to claim 14, wherein the tunnel junctions comprise a rectangular shape.

17. The MRAM device according to claim 14, wherein the tunnel junctions comprise a trapezoidal shape.

18. The MRAM device according to claim 14, wherein the tunnel junctions comprise a non-rectangular parallelogram shape.

19. A magnetic random access memory (MRAM) device, comprising:
    a plurality of first conductive lines;
    a plurality of second conductive lines disposed over the first conductive lines, the second conductive lines being positioned at an angle other than 90 degrees with respect to the first conductive lines;
    a plurality of first memory storage cells disposed between and adjacent to the first and second conductive lines;
    a plurality of second memory storage cells disposed over the second conductive lines; and
    a plurality of third conductive lines disposed over the second memory storage cells, wherein the third conductive lines are positioned non-orthogonal relative to the second conductive lines.

20. The MRAM device according to claim 19, wherein the first and second memory storage cells comprise magnetic stacks, the magnetic stacks including tunnel junctions.

21. The MRAM device according to claim 20, wherein the first conductive lines comprise wordlines and the second conductive lines comprise bitlines.

22. The MRAM device according to claim 14, wherein a logic state stored in the tunnel junction is switched by changing a current through the wordline and changing a current through the bitline.

23. A magnetic random access memory (MRAM) device, comprising:

a plurality of first conductive lines;

a plurality of second conductive lines disposed over the first conductive lines, wherein the second conductive lines are non-orthogonal to the first conductive lines; and a plurality of memory storage cells disposed at the intersections of and between the first and second conductive lines, wherein the memory storage cells comprise magnetic stacks including tunnel junctions, wherein the tunnel junctions each have the same orientation and shape, and wherein the shape is selected from the group consisting of: non-rectangular parallelogram and trapezoid.

24. The MRAM device according to claim 23, wherein the tunnel junctions have an aspect ratio of between about 1:1 and about 1:3.

25. The MRAM device according to claim 23, wherein the first conductive lines are wordlines and the second conductive lines are bitlines.

26. The MRAM device according to claim 23, wherein the first memory storage cells have material properties based on an asteroid-shaped curve.

27. The MRAM device according to claim 23, further comprising:

a plurality of second memory storage cells disposed over the second conductive lines; and a plurality of third conductive lines disposed over the second memory storage cells, wherein the third conductive lines are non-orthogonal to the second conductive lines.

28. The MRAM device according to claim 27, wherein the second memory storage cells comprise magnetic stacks, the magnetic stacks including tunnel junctions.

* * * * *